United States Patent
Breiling et al.

(10) Patent No.: US 11,443,975 B2
(45) Date of Patent: *Sep. 13, 2022

(54) PLANAR SUBSTRATE EDGE CONTACT WITH OPEN VOLUME EQUALIZATION PATHWAYS AND SIDE CONTAINMENT

(71) Applicant: Lam Research Corporation, Fremont, CA (US)

(72) Inventors: Patrick Breiling, Portland, OR (US); Ramesh Chandrasekharan, Portland, OR (US); Karl Leeser, West Linn, OR (US); Paul Konkola, West Linn, OR (US); Adrien LaVoie, Newberg, OR (US); Chloe Baldasseroni, Portland, OR (US); Shankar Swaminathan, Beaverton, OR (US); Ishtak Karim, Portland, OR (US); Yukinori Sakiyama, West Linn, OR (US); Edmund Minshall, Sherwood, OR (US); Sung Je Kim, Beaverton, OR (US); Andrew Duvall, Tualatin, OR (US); Frank Pasquale, Beaverton, OR (US)

(73) Assignee: LAM RESEARCH CORPORATION, Fremont, CA (US)

(*) Notice: Subject to any disclaimer, the term of this patent is extended or adjusted under 35 U.S.C. 154(b) by 120 days.

This patent is subject to a terminal disclaimer.

(21) Appl. No.: 16/836,062

(22) Filed: Mar. 31, 2020

(65) Prior Publication Data
US 2020/0227304 A1    Jul. 16, 2020

Related U.S. Application Data

(63) Continuation of application No. 15/431,088, filed on Feb. 13, 2017, now Pat. No. 10,622,243.
(Continued)

(51) Int. Cl.
*H01L 21/687* (2006.01)
*H01L 21/67* (2006.01)
(Continued)

(52) U.S. Cl.
CPC .. *H01L 21/68785* (2013.01); *H01J 37/32082* (2013.01); *H01J 37/32715* (2013.01);
(Continued)

(58) Field of Classification Search
CPC ......... H01L 21/68785; H01L 21/67207; H01L 21/67011; H01L 21/67017;
(Continued)

(56) References Cited

U.S. PATENT DOCUMENTS

| 2,955,829 A | 10/1960 | Brewster |
| 10,622,243 B2 * | 4/2020 | Breiling ............ H01L 21/67207 |

(Continued)

FOREIGN PATENT DOCUMENTS

| CN | 101471275 B | 4/2011 |
| JP | H07238380 A | 9/1995 |

(Continued)

OTHER PUBLICATIONS

First Office Action in corresponding Taiwanese Application No. 106136280 dated Jun. 30, 2021.
(Continued)

*Primary Examiner* — Laura Edwards

(57) ABSTRACT

A pedestal for a substrate processing system includes a pedestal body including a substrate-facing surface. An annular band is arranged on the substrate-facing surface that is configured to support a radially outer edge of the substrate. A cavity is defined in the substrate-facing surface of the pedestal body and is located radially inside of the annular band. The cavity creates a volume between a bottom surface of the substrate and the substrate-facing surface of the (Continued)

pedestal body. A plurality of vents pass though the pedestal body and are in fluid communication with the cavity to equalize pressure on opposing faces of the substrate during processing.

24 Claims, 9 Drawing Sheets

Related U.S. Application Data

(60) Provisional application No. 62/414,072, filed on Oct. 28, 2016.

(51) Int. Cl.
    *H01J 37/32*     (2006.01)
    *C23C 16/458*     (2006.01)
    *B05C 13/02*     (2006.01)

(52) U.S. Cl.
    CPC .. *H01L 21/67011* (2013.01); *H01L 21/67017* (2013.01); *H01L 21/67207* (2013.01); *H01L 21/68735* (2013.01); *H01L 21/68742* (2013.01); *H01L 21/68757* (2013.01); *B05C 13/02* (2013.01); *C23C 16/4581* (2013.01); *C23C 16/4583* (2013.01); *H01J 37/32642* (2013.01); *H01J 2237/334* (2013.01); *H01L 21/6715* (2013.01); *H01L 21/67069* (2013.01)

(58) Field of Classification Search
    CPC ......... H01L 21/68735; H01L 21/68742; H01L 21/68757; H01L 21/6715; H01L 21/67069; H01L 21/6835; H01J 37/32082; H01J 37/32715; H01J 37/32642; H01J 2237/334; C23C 16/4583; C23C 16/4581; C23C 14/00; C23C 16/4585; C23C 16/4586; C23C 16/5096; B05C 13/02
    USPC .... 118/728, 723 I, 723 IR, 500; 156/345.24, 156/345.48
See application file for complete search history.

(56) References Cited

U.S. PATENT DOCUMENTS

| | | | |
|---|---|---|---|
| 2001/0047762 | A1 | 12/2001 | Hayashi |
| 2004/0099375 | A1 | 5/2004 | He et al. |
| 2005/0000449 | A1* | 1/2005 | Ishibashi ............. C23C 16/4585 |
| | | | 118/728 |
| 2007/0040265 | A1 | 2/2007 | Umotoy et al. |
| 2008/0314319 | A1* | 12/2008 | Hamano ........... H01L 21/68742 |
| | | | 118/728 |
| 2011/0147363 | A1 | 6/2011 | Yap et al. |
| 2012/0264051 | A1 | 10/2012 | Angelov et al. |
| 2012/0309175 | A1* | 12/2012 | Masumura ........ H01L 21/68735 |
| | | | 438/478 |
| 2014/0262043 | A1 | 9/2014 | Frazier et al. |
| 2015/0179412 | A1 | 6/2015 | Chhatre et al. |
| 2015/0368829 | A1 | 12/2015 | Ngo et al. |
| 2016/0079036 | A1 | 3/2016 | Kang et al. |
| 2016/0172165 | A1 | 6/2016 | Jeon et al. |

FOREIGN PATENT DOCUMENTS

| | | |
|---|---|---|
| JP | H11111707 A | 4/1999 |
| JP | 2005125997 A | 5/2005 |
| JP | 2009504925 A | 2/2009 |
| JP | 2016122837 A | 7/2016 |
| KR | 20150073123 A | 6/2015 |
| KR | 20150129814 A | 11/2015 |
| KR | 20160031420 A | 3/2016 |
| TW | M431430 U | 6/2012 |
| TW | 201602403 A | 1/2016 |

OTHER PUBLICATIONS

First Office Action for corresponding Japanese Application No. 2017-202502 dated Nov. 9, 2021.

First Office Action for corresponding Korean Application No. 10-2017-0125171 dated Nov. 11, 2021.

* cited by examiner

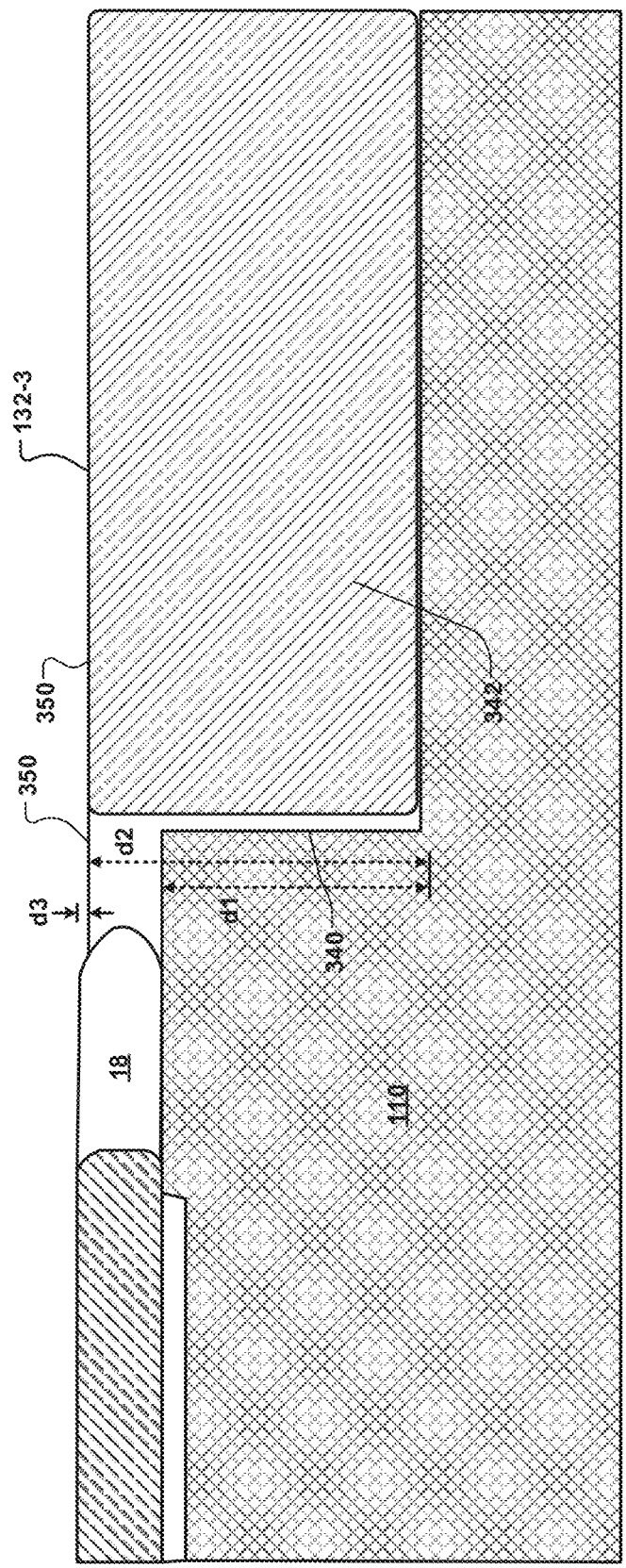

PLANAR SUBSTRATE EDGE CONTACT WITH OPEN VOLUME EQUALIZATION PATHWAYS AND SIDE CONTAINMENT

CROSS-REFERENCE TO RELATED APPLICATIONS

This application is a continuation of U.S. application Ser. No. 15/431,088 (now U.S. Pat. No. 10,622,243), filed Feb. 13, 2017, which claims the benefit of U.S. Provisional Application No. 62/414,072, filed on Oct. 28, 2016. The entire disclosures of the applications referenced above are incorporated herein by reference.

FIELD

The present disclosure relates to substrate processing systems, and more particularly to pedestals for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit, etch or treat film on a substrate such as a semiconductor wafer. The substrate processing systems typically include a processing chamber, a gas distribution device and a pedestal. During processing, the substrate is arranged on the pedestal. Different gas mixtures may be introduced into the processing chamber to treat the film. Substrate heating and/or radio frequency (RF) plasma may also be used to activate chemical reactions.

A carrier ring of the pedestal typically contacts the substrate in a narrow band along a radially outer edge of the substrate. Typically, the narrow band has a width of 1.0 to 1.5 mm. Minimum contact area (MCA) pins are used to support a center region of the substrate. The MCA pins at the center of the substrate lift the center of the substrate higher than the narrow band supporting an outer edge of the substrate to create a substrate bowing condition. In other words, top surfaces of the MCA pins are raised higher than a planar surface defined by the narrow band. The substrate edge contacts the carrier ring with tangent line or line contact. This requires precise alignment of the substrate and the pedestal during delivery and processing. Due to the precision required and the limits of 'on-site' setup, the pins and the carrier ring do not typically block deposition on a back side of the substrate sufficiently. Since the amount of contact with the backside edge of the substrate is also limited, this approach is also less tolerant with respect to off-center substrate placement.

SUMMARY

A pedestal for a substrate processing system includes a pedestal body including a substrate-facing surface. An annular band that is arranged on the substrate-facing surface is configured to support a radially outer edge of the substrate. A cavity is defined in the substrate-facing surface of the pedestal body and is located radially inside of the annular band. The cavity creates a volume between a bottom surface of the substrate and the substrate-facing surface of the pedestal body. A plurality of vents pass through the pedestal body and are in fluid communication with the cavity to equalize pressure on opposing faces of the substrate during processing.

In other features, the band has a width in a range from 4 mm to 12 mm. The band has a width in a range from 5 mm to 9 mm. The band has a width in a range from 6 mm to 7 mm. The band has a surface roughness (Ra) in a range from 2 to 32. The surface roughness (Ra) in a range from 2 to 24. The surface roughness (Ra) in a range from 2 to 16.

In other features, the plurality of vents include a first vent portion extending radially inwardly from a radially outer side of the pedestal body and a second vent portion extending from a radially inner edge of the first vent portion to the cavity.

In other features, the plurality of vents include a first vent portion extending axially from a bottom side of the pedestal body towards the cavity and a second vent portion including a plurality of holes connecting the first vent portion to the cavity.

In other features, the band is made of a material selected from a group consisting of a dielectric coating formed on a surface of a conductive material, an uncoated conductive material, an uncoated metal, and an uncoated dielectric material.

In other features, a ring is arranged radially outside of the substrate and the band. A top surface of the ring is arranged above a top surface of the substrate. The ring is made of a dielectric material.

In other features, the dielectric material is selected from a group consisting of alumina, aluminum nitride, sapphire, quartz, and silicon oxide. A ring includes a radially inner surface arranged radially inside of and below the substrate and a radially outer surface arranged radially outside of the substrate. A top surface of the ring is parallel to a top surface of the substrate. The ring is made of a dielectric material.

In other features, the dielectric material is selected from a group consisting of alumina, aluminum nitride, sapphire, quartz, and silicon oxide. The pedestal body includes an annular notch around a radially outer edge thereof. A ring is arranged in the annular notch. A bottom surface of the ring lies below a bottom surface of the substrate. A top surface of the ring lies below a top surface of the substrate. The ring is made of a dielectric material.

In other features, the dielectric material is selected from a group consisting of alumina, aluminum nitride, sapphire, quartz, and silicon oxide.

In other features, a plurality of pins is arranged in the cavity to support a center of the substrate. A top surface of the pins is one of below, parallel to or above a top surface of the annular band during processing.

In other features, a plurality of projections supports a center of the substrate. A top surface of the projections is one of below, parallel to or above a top surface of the annular band. A backside surface of the substrate along the radially outer edge of the substrate is parallel to the band during processing.

A substrate processing system includes a processing chamber and the pedestal. The pedestal is arranged in the processing chamber. An RF generator is arranged in the processing chamber.

In other features, a plurality of minimum contact area (MCA) pins extends from the pedestal body. A controller is configured to extend the MCA pins during processing such that a top surface of the MCA pins is one of below, parallel to or above the band.

In other features, a plurality of projections extends upwardly from the pedestal body in the cavity.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 11 is a perspective view of an example of a ring including a top surface located below a top surface of a substrate according to the present disclosure.

In the drawings, reference numbers may be reused to identify similar and/or identical elements.

DETAILED DESCRIPTION

A pedestal according to the present disclosure includes an annular band that faces upwardly and that supports a radially outer edge of the substrate during processing. The annular band has a significantly larger width as compared to the narrow band described above. An outer diameter of the substrate along the backside surface of the substrate is kept in parallel or tangential contact with the annular band.

An upper surface of the pedestal defines a cavity between a bottom surface of the substrate and the upper surface of the pedestal. The cavity is arranged radially inside of the annular band. Vents are provided to allow gas to flow from a main processing volume of a processing chamber to a volume of the cavity under the substrate. In some examples, MCA pins are used to support the center of the substrate. In other examples, a plurality of fixed projections extends from the upper surface of the pedestal in the cavity to support the center of the substrate.

A ring of dielectric material may be arranged radially outside of the annular band. A radially inner portion of the ring may be located radially inside of, adjacent to or radially outside of an outer diameter of the substrate. A top surface of the ring may be located above, parallel to or below a top surface of the substrate.

The annular band of the pedestal according to the present disclosure provides a wider contact area at the edge of the backside of the substrate, which increases the substrate position tolerance. The vents provide pressure equalization between the volume in the cavity and the main processing volume. The vents can be radially directed to an outer diameter of the pedestal or axially directed from a bottom of the pedestal. The number of vents and the size of vent passages will vary depending on the process pressure and gas flows that are used in a particular process.

The width of the annular band varies depending on the process temperatures and chemistries used to deposit film on the substrate. The geometry and location of the ring varies relative to the substrate diameter and the pedestal to tune process variables for a particular film to be deposited. The thickness, volume and shape of the ring may be varied depending on the process variables for a particular film to be deposited.

Figure 1:
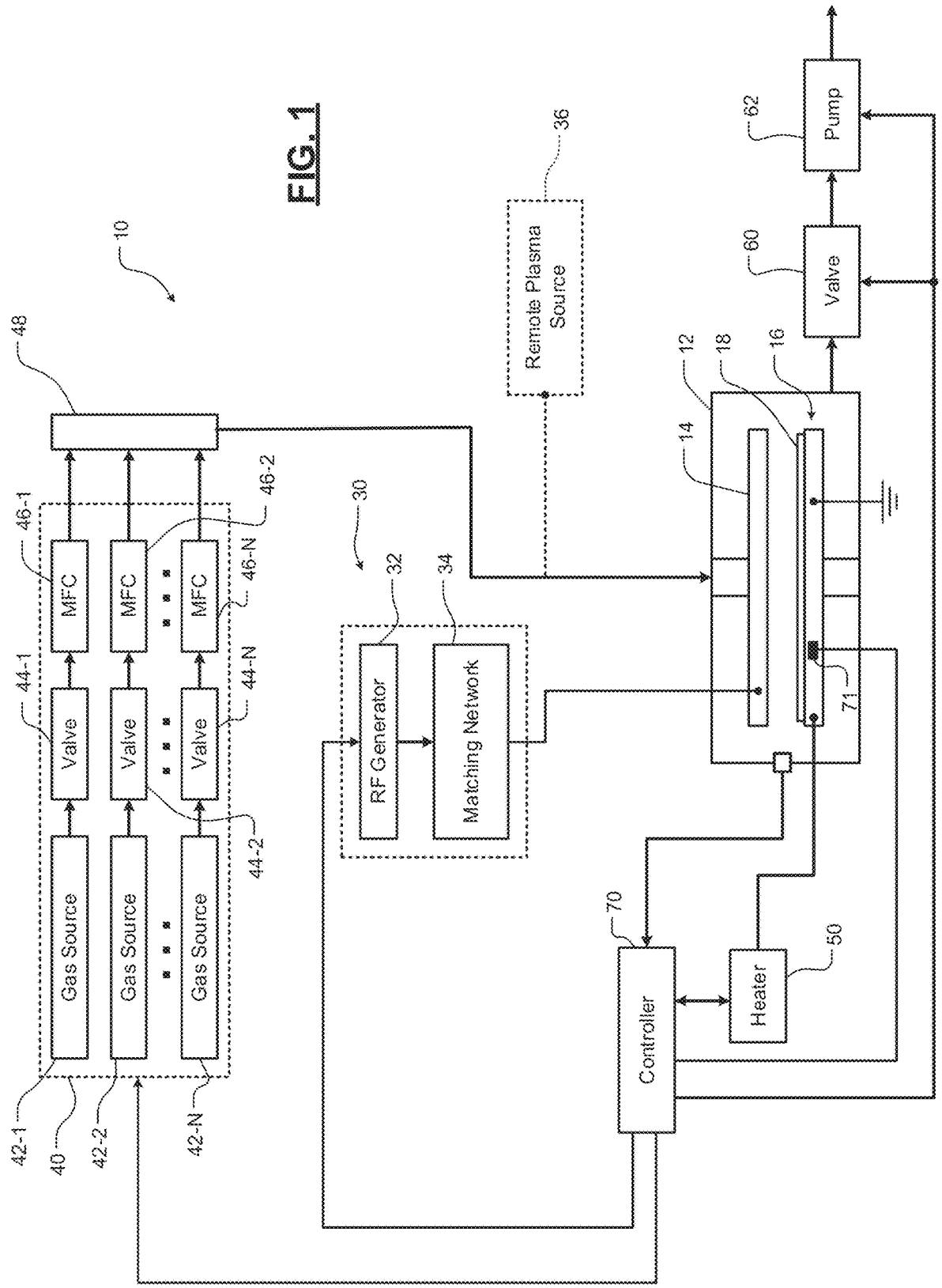
FIG. 1 is a functional block diagram of an example of a substrate processing system including a pedestal according to the present disclosure.

Referring now to FIG. 1, an example of a substrate processing system for performing deposition described herein is shown. While specific examples of substrate processing systems are shown, other substrate processing systems can be used. In some examples, the substrate processing system performs plasma enhanced (PE) deposition of film. In some examples, the substrate processing system performs plasma-enhanced chemical vapor deposition (PECVD) or plasma-enhanced atomic layer deposition (PEALD), although other processes can be performed.

A substrate processing system 10 includes a processing chamber 12 that encloses other components of the substrate processing system 10 and contains the RF plasma (if used for a particular substrate treatment). The substrate processing system 10 includes a showerhead 14 and a pedestal assembly 16. A substrate 18 is arranged on the pedestal assembly 16. The showerhead 14 introduces and distributes process gases.

If plasma is used, the plasma can be direct or remote plasma. In this example, an RF generating system 30 generates and outputs an RF voltage to either the showerhead 14 or the pedestal assembly 16 (the other is DC grounded, AC grounded or floating). For example only, the RF generating system 30 may include an RF voltage generator 32 that generates the RF voltage that is fed by a matching network 34 to the showerhead 14 or the pedestal assembly 16. Alternately, the plasma may be delivered by a remote plasma source 36.

A gas delivery system 40 includes one or more gas sources 42-1, 42-2, ..., and 42-N (collectively gas sources 42), where N is an integer greater than zero. The gas sources 42 supply one or more etch gas mixtures, precursor gas mixtures, cleaning gas mixtures, ashing gas mixtures, etc. to the processing chamber 12. Vaporized precursor may also be used. The gas sources 42 are connected by valves 44-1, 44-2, ..., and 44-N (collectively valves 44) and mass flow controllers 46-1, 46-2, ..., and 46-N (collectively mass flow controllers 46) to a manifold 48. An output of the manifold 48 is fed to the processing chamber 12. For example only, the output of the manifold 48 is fed to the showerhead 14.

A heater 50 may be connected to a heater coil (not shown) arranged in the pedestal assembly 16. The heater 50 may be used to control a temperature of the pedestal assembly 16 and the substrate 18. A valve 60 and pump 62 may be used to evacuate reactants from the processing chamber 12. A controller 70 may be used to control components of the substrate processing system 10. For example only, the controller 70 may be used to control flow of process gases, monitoring of process parameters such as temperature, pressure, power, etc, striking and extinguishing plasma, removal of reactants, etc.

In some examples, minimum contact area (MCA) pins 71 are used to support a center region of the substrate 18 during processing. If used, the controller 70 may also be used to actuate the MCA pins 71. In some examples, a top surface of the MCA pins 71 are positioned at a height that is below, parallel to or above a top surface of the annular band to provide parallel contact between the substrate and the annular band. In some examples, the MCA pins 71 are made of sapphire, although other materials can be used. The MCA pins 71 can be set such that the height is above, parallel, or below the annular band in order to modify the contact force between the substrate (wafer) and the annular ring (seal band). Higher contact force can ensure reduced backside deposition on the substrate by reducing the gap between substrate and annular ring. There are limits on both how far above and below the MCA pins 71 can be to the annular ring; in both directions, going too far reduces the contact force between substrate and ring thereby increasing gap.

Figure 2:
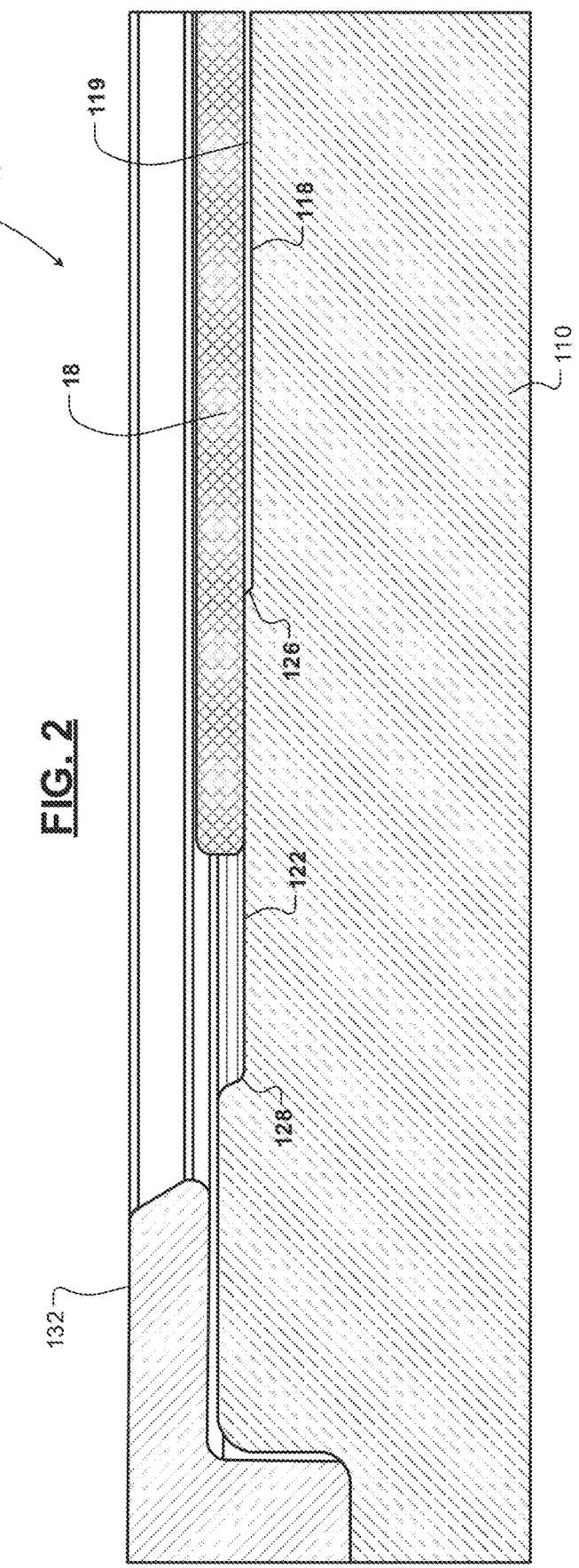
FIG. 2 is a side cross-sectional view of an example a pedestal according to the present disclosure.
Figure 3:
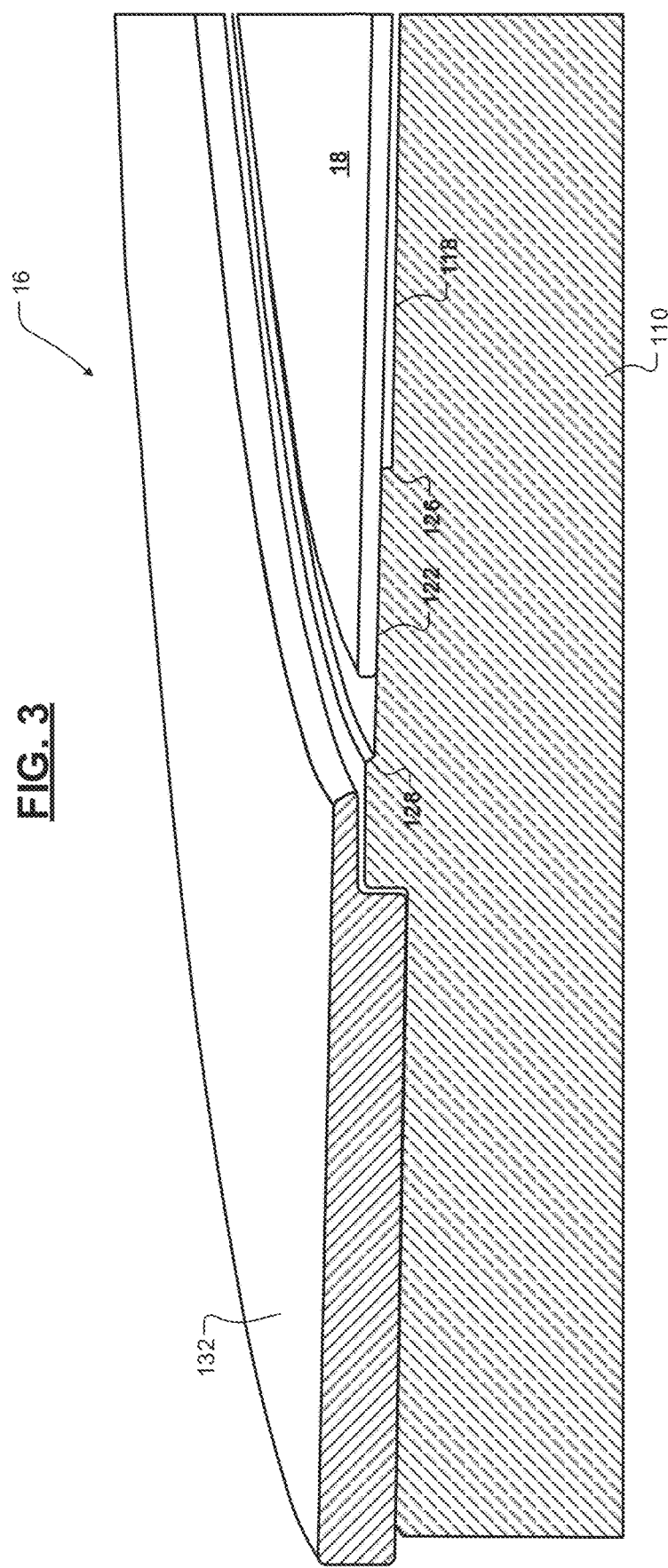
FIG. 3 is a perspective view of an example a pedestal according to the present disclosure.

Referring now to FIGS. 2-3, the pedestal assembly 16 includes a pedestal body 110 that supports the substrate 18. A cavity 118 may be defined between the substrate 18 and a top surface 119 of the pedestal body 110. In some examples, the cavity 118 has a cylindrical shape. An annular band 122 is arranged radially outside of the cavity 118. In some examples, the annular band 122 is planar and includes a radially inner edge 126 and a radially outer edge 128. The outer diameter of the substrate 18 is kept in parallel or tangential contact with the annular band 122 during processing. A ring 132 is arranged on the pedestal body 110 generally radially outside of the substrate 18.

In some examples, the annular band 122 has a surface roughness $R_a$ of 2-32. In some examples, the annular band 122 has a surface roughness $R_a$ of 2-24. In some examples, the annular band 122 has a surface roughness $R_a$ of 2-16. In some examples, the annular band 122 has a surface roughness $R_a$ of 2-8.

A radial width of the annular band 122 is selected to be sufficiently wide enough to ensure that the substrate edge remains in contact regardless of the substrate placement. In some examples, the annular band 122 has a radial width in a range from 4 mm to 12 mm. In some examples, the annular band 122 has a radial width in a range from 5 mm to 9 mm. In some examples, the annular band 122 has a radial width in a range from 6 mm to 7 mm.

A material that forms the annular band 122 may include a dielectric coating formed on a surface of a conductive material, an uncoated conductive material or metal, or an uncoated dielectric material. The material used for the annular band 122 may be selected so that it does not chemically interact with process chemistries that are used to deposit the film. Additional criteria for selection include impedance and plasma interaction. In some examples, the material used for the annular band 122 may also be selected to provide a specific interaction with some process chemistries.

Figure 4:
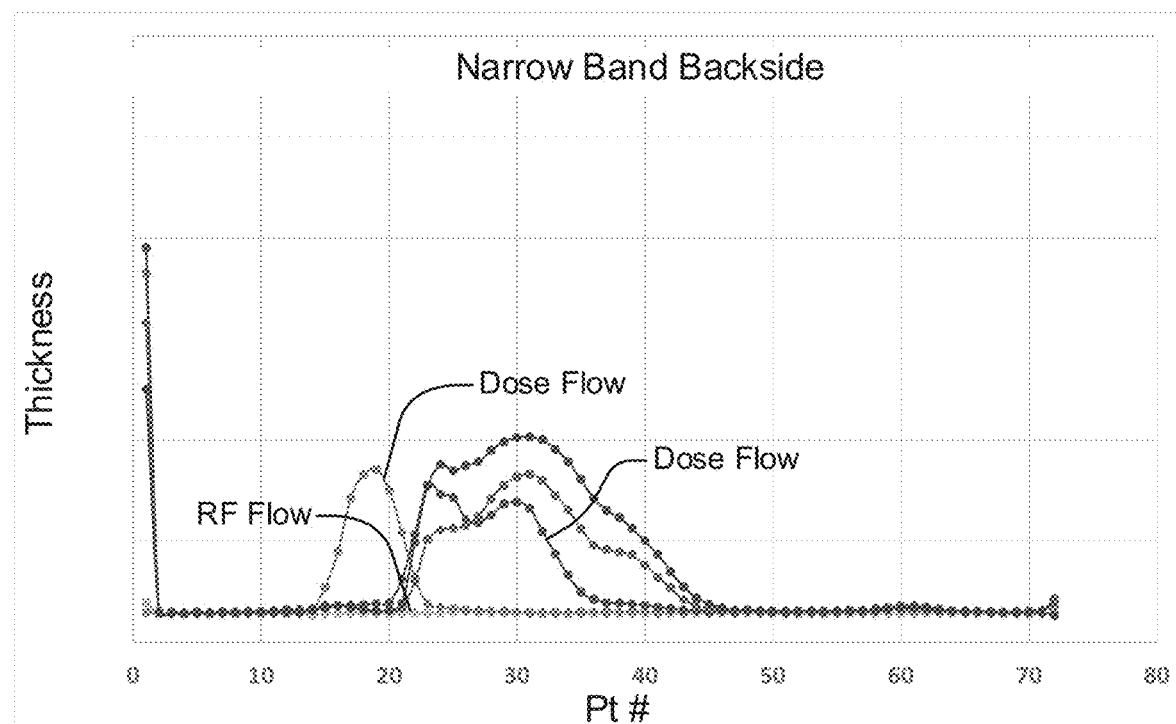
FIGS. 4-5 are graphs illustrating back side deposition thickness for a narrow band according to the prior art and for a wider band according to the present disclosure, respectively.
Figure 5:
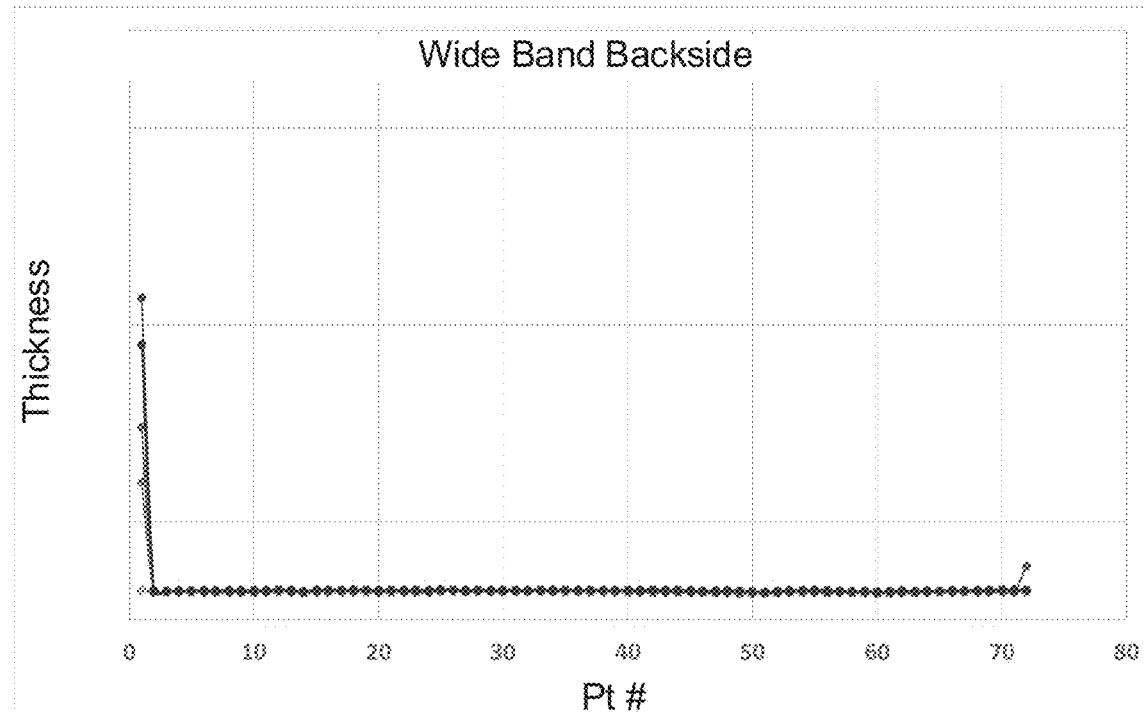

Referring now to FIGS. 4-5, the impact of a width of the annular band 122 on back side deposition is shown. As can be seen, when the annular band 122 has a narrow width as described above, backside deposition tends to occur as shown in FIG. 4. When the annular band 122 has a wider width as disclosed herein, back side deposition is reduced or eliminated as shown in FIG. 5.

Figure 6:
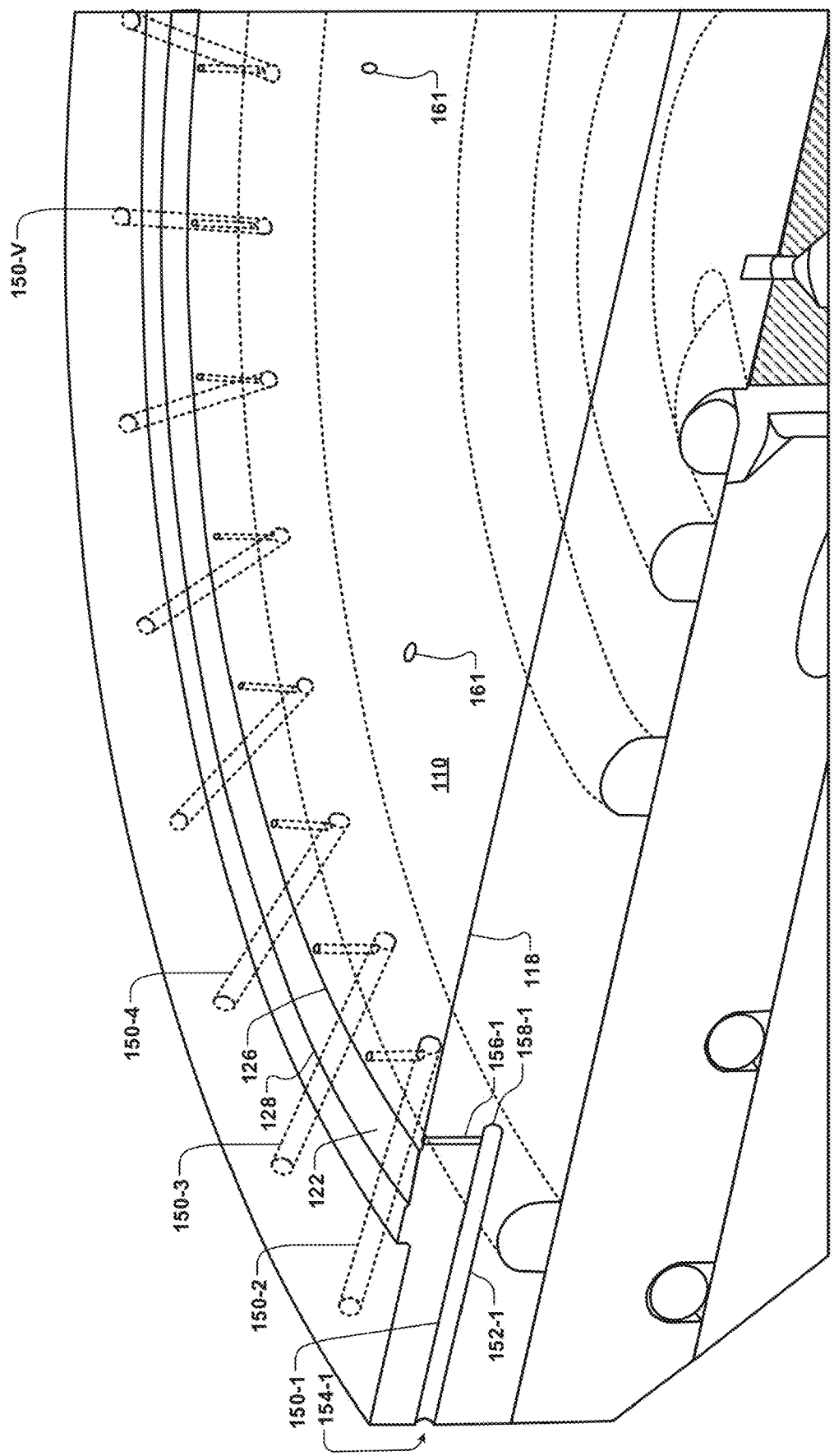
FIG. 6 is a perspective view of an example of a pedestal including radial vents to a cavity under the substrate according to the present disclosure.
Figure 7:
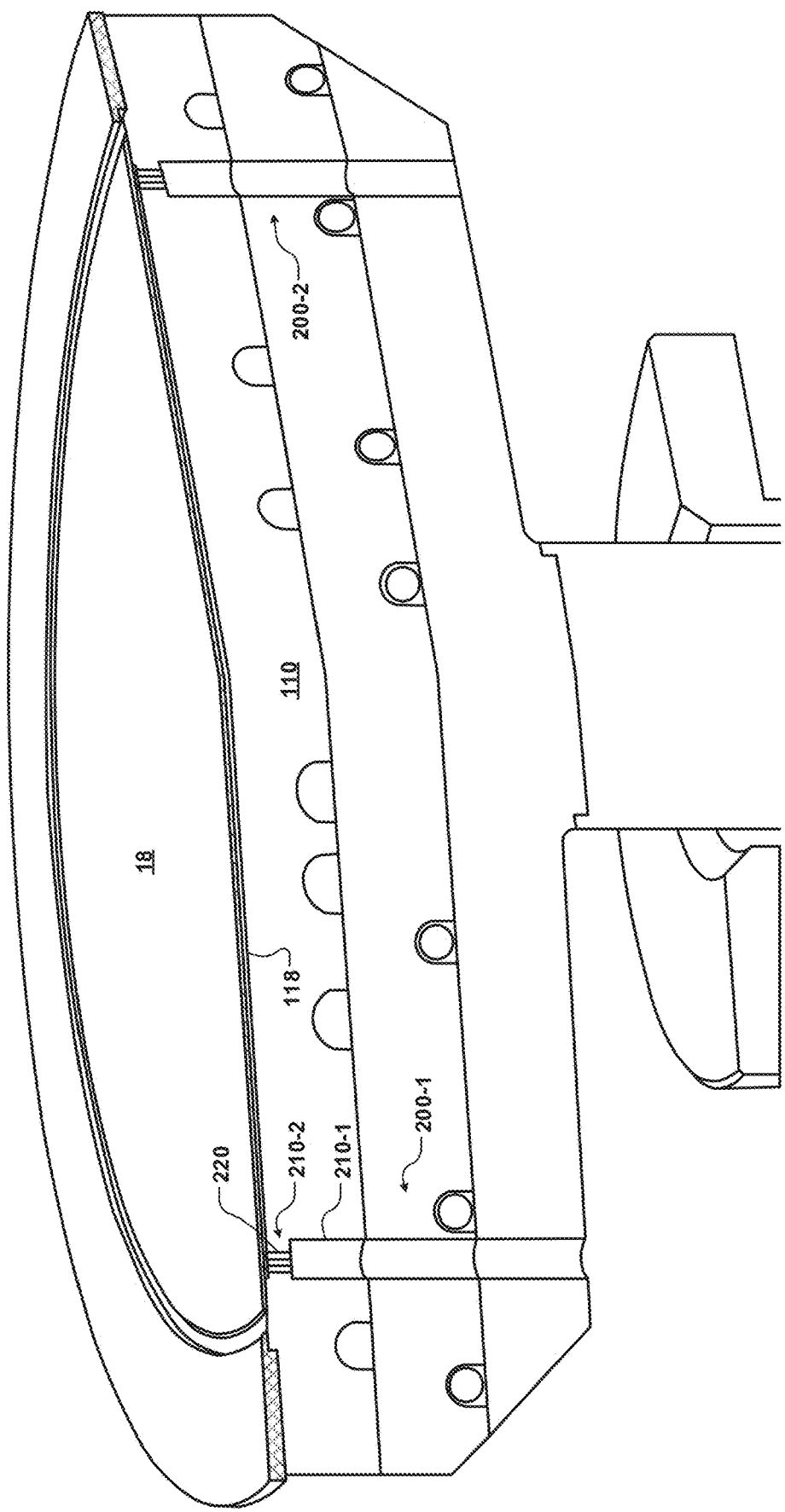
FIG. 7 is a perspective view of an example of a pedestal including axial vents to the cavity under the substrate according to the present disclosure.

Referring now to FIGS. 6-7, several different variations are shown for venting the volume in the cavity 118 to provide pressure equalization with the main processing volume. The venting provides pressure equalization between opposing surfaces of the substrate 18 to reduce movement of the substrate 18 on the annular band 122. The reduced movement tends to improve deposition uniformity and to prevent back side deposition.

For example in FIG. 6, the pedestal body 110 includes a plurality of vents 150-1, 150-2, 150-3, . . . 150-V (collectively vents 150) (where V is an integer greater than or equal to one). As can be appreciated, the number of vents can be adjusted as needed to provide suitable dynamic pressure equalization. The vents 150 provide fluid communication between the main processing volume and the volume in the cavity 118 below the substrate 18. In this example, the vents 150 include a first vent portion 152-1 extending in a radial direction and including an opening 154-1 located on a radially outer surface of the pedestal body 110. A second vent portion 156-1 extends in an axial direction from a radially inner end 158-1 of the first vent portion 152-1 to an upper surface of the pedestal body 110 in the cavity 118. The first vent portion 152-1 and the second vent portion 156-1 provide a path for fluid communication between the volume under the substrate (in the cavity 118) and the main processing volume in which processing occurs. In other words, pressure equalization occurs because the main volume of the processing chamber includes the top surface of the substrate 18 and the vents 150 provide pressure equalization in the volume of the cavity 118 below the substrate 18 to prevent substrate movement.

A height of the cavity 118 under the substrate 18 is selected to allow the exchange of gases into and from the cavity 118 without creating an upward pressure on the substrate 18 that is large enough to cause the substrate 18 to move within predetermined limits. In some examples, the cavity 118 has a depth in the range from 0.004" to 0.010". In some examples, the cavity has a depth in the range from 0.004" to 0.008". A plurality of MCA pins 161 may be used to support and lift a center of the substrate 18. In some examples, the MCA pins 161 are moved to a height where a top surface of the MCA pins 161 are parallel to a top surface of the annular band 122. In some examples, the MCA pins 161 are moved to a height where a top surface of the MCA pins 161 are above a top surface of the annular band 122. In some examples, the MCA pins 161 may include three or six MCA pins, although additional or fewer MCA pins can be used.

In FIG. 7, another example of a vent arrangement is shown. A plurality of vents 200-1 and 200-2 (collectively vents 200) are arranged in an axial direction to vent fluid from the main processing volume to the cavity 118 arranged below the substrate 18. As can be appreciated, while two vents are shown, additional vents may be arranged radially around the pedestal body 110 at spaced intervals. In some examples, the vent 200-1 includes a first vent portion 210-1 extending from a bottom surface of the pedestal body 110, through one or more layers of the pedestal body 110 to (or a location near but spaced from) a top surface of the pedestal in the cavity 118. A second vent portion 210-2 optionally connects the first vent portion 210-1 to the cavity 118. In some examples, each of the second vent portions 210-2 includes a plurality of spaced through holes 220 having opposite ends in fluid communication with the first vent portion 210-1 and the cavity 118, respectively.

In some examples, the first vent portions 210-1 have a diameter in a range from 0.2" to 0.8". In some examples, the first vent portions 210-1 have a diameter in a range from 0.3" to 0.5". In some examples, the plurality of spaced through holes 220 are approximately an order of magnitude smaller than the first vent portion 210-1. In some examples, the plurality of spaced through holes 220 have a diameter in a range from 0.01" to 0.08". In some examples, the plurality of spaced through holes 220 have a diameter in a range from 0.01" to 0.03".

Figure 8:
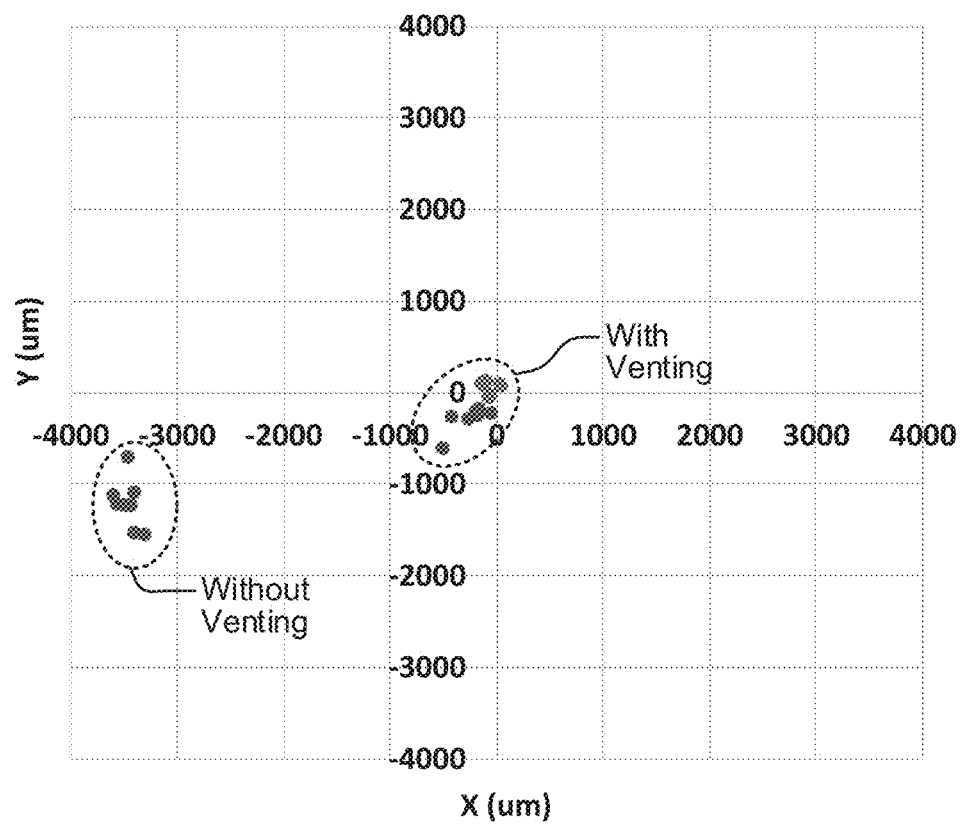
FIG. 8 is a graph illustrating samples of changes in position of a substrate during processing with venting according to the present disclosure and without venting according to the prior art.

Referring now to FIG. 8, a plurality of substrates are delivered to a process, treated and then retrieved. The substrates are initially delivered near a (0,0) point and are subsequently picked up by a robot arm after processing. As can be appreciated, the pickup location of the robot arm provides an indication of how much the substrate moved during processing. When the pedestal body is not vented, the substrates tend to move on the top surface of the pedestal body due to a pressure differential between the main processing volume and the volume in the cavity 118. In contrast, the substrate moves less when venting is used. As the substrate moves relative to the ring, localized differences in deposition may occur. When there is decreased movement of the substrate 18, there is less variation in deposition.

Figure 9:
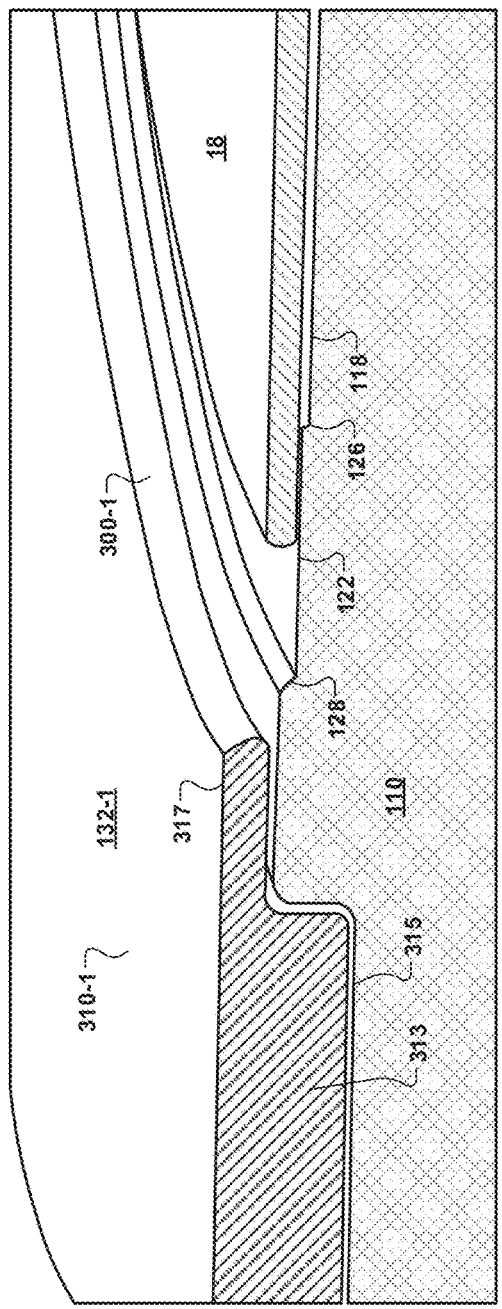
FIG. 9 is a perspective view of an example of a ring including a top surface located above a top surface of a substrate according to the present disclosure.
Figure 10:
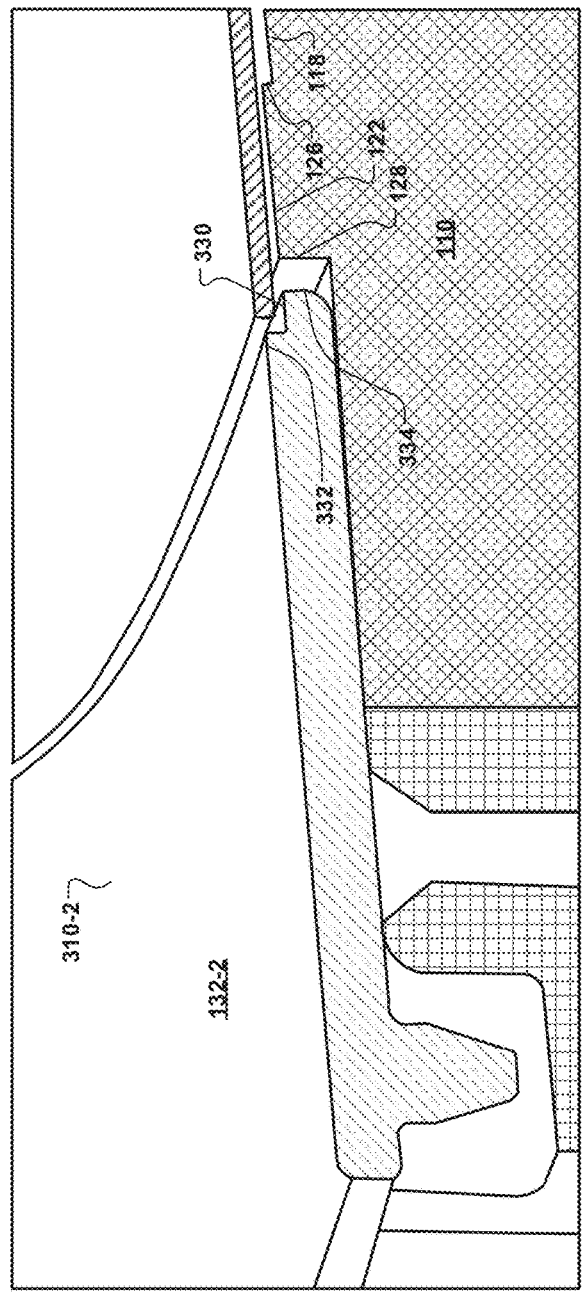
FIG. 10 is a perspective view of an example of a ring including a top surface located parallel to a top surface of a substrate according to the present disclosure.

Referring now to FIGS. 9-11, various example arrangements for the ring 132 are shown. The ring 132 has a generally annular shape and can be made of a dielectric material. In some examples, the dielectric material is selected from alumina, aluminum nitride, sapphire, quartz, and silicon oxide. In FIG. 9, the ring 132-1 is arranged radially outside an outer diameter (OD) of the substrate and the annular band 122. The ring 132-1 includes a lower portion 313 that is received in a notch 315 of the pedestal body 110. The ring 132-1 further includes an upper portion 317. In some examples, the upper portion 317 of the ring 132-1 has a larger radial thickness as compared to the lower portion 313. The ring 132-1 includes a radially inner surface 300-1 that is spaced radially outside of the radially outer edge 128 of the annular band 122 and the radially outer edge of the substrate 18. A top surface 310-1 of the ring 132-1 is located above, parallel to or below a top surface of the substrate 18.

In FIG. 10, the ring 132-2 includes a first annular notch 330 that at least partially lies underneath a radially outer edge of the substrate 18. The first annular notch 330 is arranged radially inside of an outer diameter of the substrate 18 and radially outside of the annular band 122. The ring 132-2 further includes a radially innermost surface 334 that is spaced radially inside of the radially outer edge of the substrate 18. A radially inner top surface 332 of the ring 132-2 provides relief to accommodate the radially outer edge of the substrate 18. A top surface 310-2 of the ring 132-2 is located below, above or parallel to a top surface of the substrate 18. In some examples, the top surface 310-2 lies in a plane that is parallel to a plane including the top surface of the substrate 18.

In FIG. 11, the pedestal body 110 includes an annular recess 340 arranged around a radially outer edge of the pedestal body 110. A ring 132-3 has an annular shape and includes a lower portion 342 having an axial height d2 that is greater than an axial height d1 of the annular recess 340. A top surface 350 of the ring 132-3 is arranged in a plane that is parallel to a top surface of the substrate 18 or above or below a top surface of the substrate 18 by a distance d3.

The ring 132 modifies an ionization rate and electron density adjacent to an edge of the substrate 18. The ring 132 lowers the occurrence of unwanted plasma discontinuities in this area. The ring 132 also physically constrains movement of the substrate 18 on the pedestal body 110. The ring 132 reduces plasmoids that may occur at the edge of the substrate 18 when using some gas species, the band and/or venting. The proximity of the ring 132 at the outer diameter of the substrate 18 can reduce the electron density and ionization rates near the edge of the substrate.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor substrate or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

What is claimed is:

1. A pedestal for a substrate processing system, comprising:
   a pedestal body including a substrate-facing surface and an annular notch around a radially outer edge thereof;
   an annular band arranged on the substrate-facing surface that is configured to contact a radially outer edge of a substrate; and
   a cavity that is defined in the substrate-facing surface of the pedestal body and that is located radially inside of the annular band, wherein the cavity creates a volume between a bottom surface of the substrate and the substrate-facing surface of the pedestal body;
   a plurality of vents passing through the pedestal body and in fluid communication with the cavity to equalize pressure on opposing faces of the substrate during processing; and
   a ring that is separate from the pedestal body and that is arranged in the annular notch on the pedestal body,
   wherein a bottom surface of the ring lies below a bottom surface of the substrate,
   wherein a top surface of the ring lies below a top surface of the substrate.

2. The pedestal of claim 1, wherein the annular band has a width in a range from 4 mm to 12 mm.

3. The pedestal of claim 1, wherein the annular band has a surface roughness (Ra) in a range from 2 to 32.

4. The pedestal of claim 1, wherein the annular band is made of a material selected from a group consisting of a dielectric coating formed on a surface of a conductive material, an uncoated conductive material, an uncoated metal, and an uncoated dielectric material.

5. The pedestal of claim 1, wherein the ring is made of a dielectric material.

6. The pedestal of claim 5, wherein the dielectric material is selected from a group consisting of alumina, aluminum nitride, sapphire, quartz, and silicon oxide.

7. The pedestal of claim 1, wherein a height of the ring is greater than a depth of the annular notch on the pedestal body.

8. The pedestal of claim 1, wherein the top surface of the ring lies above a top surface of the annular band.

9. The pedestal of claim 1, further comprising:
   a plurality of pins arranged in the cavity to support a center of the substrate,
   wherein a top surface of the pins is one of below, parallel to or above a top surface of the annular band during processing.

10. The pedestal of claim 9 further comprising a controller configured to extend the pins during processing such that a top surface of the pins is one of below, parallel to, and above the top surface of the annular band.

11. The pedestal of claim 1, wherein the annular band is configured to support the bottom surface of the substrate along the radially outer edge such that the substrate is parallel to the annular band during processing.

12. A substrate processing system comprising:
 a processing chamber;
 the pedestal of claim 1, wherein the pedestal is arranged in the processing chamber; and
 an RF generator arranged in the processing chamber.

13. A pedestal for a substrate processing system, comprising:
 a pedestal body including a substrate-facing surface;
 an annular band arranged on the substrate-facing surface that is configured to contact a radially outer edge of a substrate; and
 a cavity that is defined in the substrate-facing surface of the pedestal body and that is located radially inside of the annular band,
 wherein the cavity creates a volume between a bottom surface of the substrate and the substrate-facing surface of the pedestal body;
 a plurality of vents passing through the pedestal body and in fluid communication with the cavity to equalize pressure on opposing faces of the substrate during processing; and
 a ring that is separate from the pedestal body and that is arranged radially outside of the substrate and the annular band on the pedestal body,
 wherein a top surface of the ring is arranged above a top surface of the substrate.

14. The pedestal of claim 13, wherein the ring is made of a dielectric material.

15. The pedestal of claim 14, wherein the dielectric material is selected from a group consisting of alumina, aluminum nitride, sapphire, quartz, and silicon oxide.

16. The pedestal of claim 13, wherein a bottom surface of the ring is lies below a bottom surface of the substrate.

17. The pedestal of claim 13, wherein the pedestal body includes an annular notch formed in a radially outer edge of the pedestal body.

18. The pedestal of claim 17, wherein the ring includes;
 a first portion that sits within the annular notch; and
 a second portion that extends radially inwardly of the annular notch.

19. The pedestal of claim 18, wherein a radially inner edge of the second portion of the ring is located radially outwardly of a radially outer edge of the annular band.

20. The pedestal of claim 18, wherein a first thickness of the first portion is one of greater than and less than a second thickness of the second portion.

21. A pedestal for a substrate processing system, comprising:
 a pedestal body including a substrate-facing surface;
 an annular band arranged on the substrate-facing surface that is configured to contact a substrate; and
 a cavity that is defined in the substrate-facing surface of the pedestal body and that is located radially inside of the annular band,
 wherein the cavity creates a volume between a bottom surface of the substrate and the substrate-facing surface of the pedestal body;
 a plurality of vents passing through the pedestal body and in fluid communication with the cavity to equalize pressure on opposing faces of the substrate during processing; and
 a ring that is separate from the pedestal body, that is arranged on the pedestal body, and that includes a radially inner surface arranged radially inside of and below the substrate and a radially outer surface arranged radially outside of the substrate,
 wherein a top surface of the ring is parallel to a top surface of the substrate.

22. The pedestal of claim 21, wherein the ring is made of a dielectric material.

23. The pedestal of claim 22, wherein the dielectric material is selected from a group consisting of alumina, aluminum nitride, sapphire, quartz, and silicon oxide.

24. The pedestal of claim 22, wherein a radially innermost edge of the top surface of the ring is disposed outside of a radially outer edge of the substrate.

* * * * *